(12) United States Patent
Yuasa

(10) Patent No.: US 9,618,101 B2
(45) Date of Patent: Apr. 11, 2017

(54) ACTUATOR, SAMPLE POSITIONING DEVICE, AND CHARGED PARTICLE BEAM SYSTEM

(71) Applicant: JEOL Ltd., Tokyo (JP)

(72) Inventor: Shuichi Yuasa, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/925,072

(22) Filed: Oct. 28, 2015

(65) Prior Publication Data
US 2016/0186844 A1    Jun. 30, 2016

(30) Foreign Application Priority Data

Oct. 29, 2014    (JP) ................................. 2014-219944

(51) Int. Cl.
| | | |
|---|---|---|
| H01J 37/26 | (2006.01) | |
| F16H 25/20 | (2006.01) | |
| H01J 37/20 | (2006.01) | |

(52) U.S. Cl.
CPC .............. *F16H 25/20* (2013.01); *H01J 37/20* (2013.01); *F16H 2025/204* (2013.01); *F16H 2025/2078* (2013.01); *H01J 2237/0216* (2013.01); *H01J 2237/0458* (2013.01); *H01J 2237/20221* (2013.01); *H01J 2237/20278* (2013.01); *H01J 2237/26* (2013.01)

(58) Field of Classification Search
CPC ........ H01J 37/22; H01J 37/26; H01J 2237/26; F16H 25/2214; F16H 2025/2078
USPC ................ 250/440.11, 441.11, 442.11, 443.1
See application file for complete search history.

(56) References Cited

U.S. PATENT DOCUMENTS

2014/0158907 A1*    6/2014    Hamochi ................ H01J 37/26
250/442.11

FOREIGN PATENT DOCUMENTS

JP            6300106 A        10/1994

* cited by examiner

*Primary Examiner* — Nicole Ippolito
(74) *Attorney, Agent, or Firm* — The Webb Law Firm

(57) ABSTRACT

An actuator capable of reducing vibrations of its output shaft is offered. The actuator (100) includes an electric motor (10), a ball spline (20) of finite stroke length, and a nut (32). The ball spline (20) has a shaft (22) provided with rolling grooves (23) which are formed along the axis of the spline and along which balls (24) can roll. An external thread (34) is formed on the shaft (22). The nut (32) has an internal thread (33) with which the external thread (34) threadedly mates, and operates to transmit the rotary force of the motor (10) into the shaft (22).

6 Claims, 3 Drawing Sheets

ACTUATOR, SAMPLE POSITIONING DEVICE, AND CHARGED PARTICLE BEAM SYSTEM

BACKGROUND OF THE INVENTION

Field of the Invention

The present invention relates to an actuator, sample positioning device, and charged particle beam system.

Description of Related Art

A device (known as a positioning goniometer) for placing an electron microscope sample in position is used such that the sample is brought into a desired position and held there. Usually, an actuator having a magnetic motor is used as such a positioning device for moving the sample in the X- and Y-axis directions.

An actuator of this type is disclosed, for example, in JP-A-6-300106 and has a composite shaft consisting of a threaded shaft provided with a ball spline groove that is formed in the outer surface of the threaded shaft so as to extend axially of the threaded shaft. The threaded shaft is formed with a ball threaded groove. An outer cylinder for a spline, a ball screw nut, and a hollow motor are incorporated in this order in the composite shaft from the load application side of this composite shaft.

With the actuator of JP-A-6-300106, if the hollow motor is rotationally driven, the rotational driving force of the motor drive shaft is transformed into an axial thrust force of the composite shaft via the ball screw nut. An axial reaction force responsive to this thrust force is borne by the bearings in the hollow motor with the consequent linear motion of the composite shaft. The axial load acting on the composite shaft is borne by the ball nut screw, while the torque is borne by the outer cylinder for a spline. Radial loads and moment loads in all directions are borne by the outer cylinder for a spline and by the ball screw nut. Attachments such as fingers mounted to an attachment mounting portion are placed in position along the X-, Y-, and Z-axes and along moments Mx, My, and Mz around the axes.

In the actuator set forth in JP-A-6-300106, the outer cylinder for a spline is cylindrical in shape and has an inner surface provided with a ball-rolling groove corresponding to the ball spline groove formed in the composite shaft. Multiple balls that bear the load are rollably mounted between the ball spline groove and the ball-rolling groove. A ball holder is mounted on the inner surface of the outer cylinder for a ball spline to hold the balls so as to move cyclically in alignment. The holder is provided with a plurality of cyclic ball paths to permit the balls to move cyclically between a loaded region and an unloaded region existing between the outer surface of the holder and the inner surface of the outer cylinder for a spline.

In the actuator of JP-A-6-300106, the balls are preloaded when they are between the ball spline groove formed in the composite shaft and the ball-rolling groove formed in the outer cylinder for a spline. However, the balls are not preloaded when they are in the cyclic ball path formed in the ball holder. Therefore, when the balls move into the cyclic ball path from between the spline groove and the ball-rolling groove, the balls are varied from the preloaded state to the non-preloaded state. At this time, an impact acts on the actuator, vibrating the composite shaft. Furthermore, when the balls move from the cyclic ball path to between the spline groove and the ball-rolling groove, the balls are varied from the non-preloaded state to the preloaded state. Consequently, the composite shaft vibrates similarly.

If the composite shaft, i.e., the output shaft of the actuator, vibrates, the driven object is also vibrated. For example, if the output shaft of an actuator of a device for placing an electron microscope sample in position vibrates, when the sample is moved in a given direction, vibration of the sample is caused as well as the motion of the sample in the given direction. Therefore, if a user attempts to move a sample while checking the field of view of the sample, for example, this is difficult to perform because the sample is vibrated, i.e., the field of view is vibrated.

SUMMARY OF THE INVENTION

In view of the foregoing problem, the present invention has been made. One object associated with some aspects of the present invention is to provide an actuator capable of reducing vibrations induced on the output shaft. Another object associated with some aspects of the present invention is to provide a sample positioning device including this actuator. A further object is to provide a charged particle beam system including this actuator.

(1) An actuator associated with the present invention comprises: an electric motor; a ball spline having a finite stroke length and including a shaft provided with rolling grooves which are formed along an axis and along which balls can roll, the shaft having an external thread; and a nut having an internal thread with which the external thread of the shaft threadedly mates, the nut being operative to transmit the rotary force of the motor to the shaft.

In this actuator, the ball spline of finite stroke length is used. That is, the ball spline does not have any cyclic ball path and so the preload applied to the balls can be made constant. Consequently, vibrations can be prevented. Thus, in this actuator, vibrations of the output shaft can be reduced during operation. Vibrations produced when a thrust force is applied to a driven object can be reduced.

Furthermore, in this actuator, the rotary force of the motor is transmitted to the shaft by the nut having the internal thread with which the external thread on the shaft threadedly mates. Consequently, higher rigidity and lower vibration transmission efficiency can be achieved, for example, than where a ball screw is used to transform the rotary force of a motor into a thrust force by causing balls to cycle through a helical rolling groove formed in a ball screw shaft. As a result, minute (e.g., micrometer order) vibrations due to the magnetic hysteresis of the motor and minute vibrations caused by unintentional excitation of the motor due to servo noises can be suppressed from being directly transmitted to the shaft. In this actuator, therefore, vibrations of the shaft can be reduced. Also, vibrations produced when a thrust force is applied to the driven object can be reduced.

Additionally, in this actuator, the driven object can be moved over a wider range, for example, than where a thrust force is applied to the driven object using a piezoelectric device. During a process in which the piezoelectric device expands or contracts, it is difficult to control the expansion or contraction of the piezoelectric device linearly in terms of time and so it takes long to permit the piezoelectric device to settle down. In the novel actuator, the rotary force of the motor is transmitted by the nut and shaft. Consequently, higher rigidity can be accomplished, and the settling time can be shortened.

(2) In one feature of this actuator, the shaft and the nut may together constitute a sliding screw for transforming the rotary motion of the motor into a linear motion.

In this actuator, the rotary motion of the motor is transformed into a linear motion by the sliding screw and, therefore, higher rigidity and lower vibration transfer efficiency can be achieved, for example, than where a ball screw is used to transform the rotary force of a motor into a linear motion by causing balls to cycle through a helical rolling groove formed in a ball screw shaft. As a result, minute vibrations due to the magnetic hysteresis of the motor and minute vibrations caused by unintentional excitation of the motor due to servo noises can be suppressed from being directly transmitted to the shaft.

(3) In another feature of this actuator, the balls may roll only along the rolling grooves formed in the ball spline.

In this actuator, the balls roll only along the rolling grooves and so the preload applied to the balls can be made constant; otherwise, vibrations would be produced. Therefore, in this actuator, during operation, vibrations of the shaft can be reduced. It is possible to reduce vibrations produced when a thrust force is applied to the driven object.

(4) In a further feature of this actuator, the nut may be secured to a rotor of the motor.

(5) A sample positioning device associated with the present invention is adapted to place a sample in position within a sample chamber of a charged particle beam system. The sample positioning device includes an actuator associated with the present invention.

This sample positioning device includes the actuator associated with the present invention and so vibrations of the sample can be reduced. Especially, when the actuator of the sample positioning device is in operation, vibrations of the shaft can be reduced. Therefore, when the sample is moved in a given direction, vibrations of the sample can be reduced. This permits the user to observe the sample at high magnification while moving the sample in a desired direction.

Furthermore, in this sample positioning device, the sample can be moved over a wider range, for example, than a sample positioning device using an actuator including a piezoelectric device. Also, a shorter settling time can be achieved. Therefore, in this sample positioning device, minute vibrations of the sample are possible, for example, throughout the sample. After the sample has been moved, drift can be made to settle down in a shorter time.

(6) A charged particle beam system associated with the present invention includes a sample positioning device associated with the present invention.

Since this charged particle beam system includes the sample positioning device associated with the present invention, vibrations of the sample can be reduced.

(7) A charged particle beam system associated with the present invention includes an actuator associated with the present invention.

This charged particle beam system can include an actuator capable of reducing vibrations of a shaft, i.e., the output shaft of the actuator.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. Actuator

Figure 1:
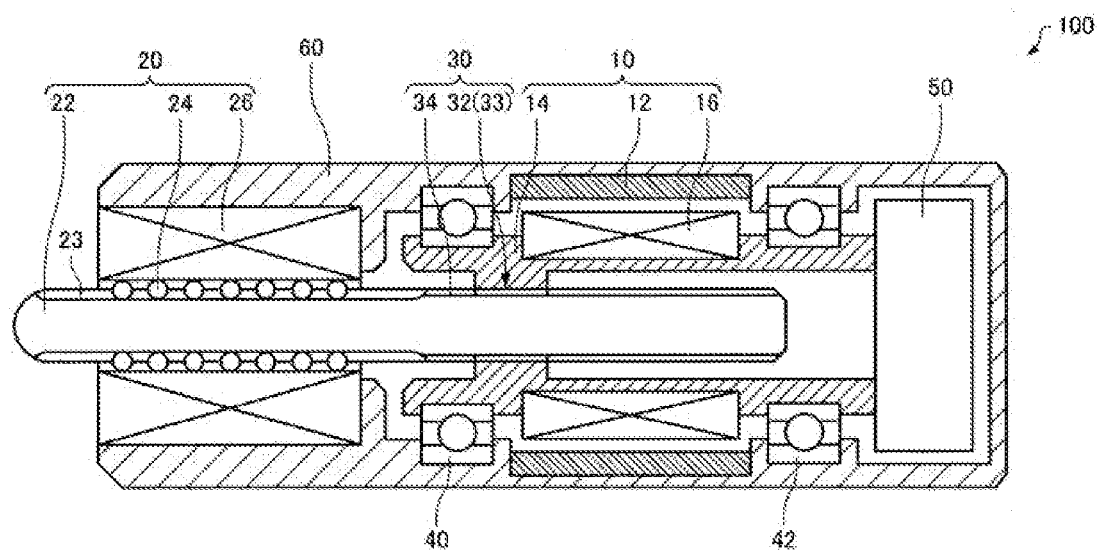
FIG. 1 is a schematic cross-sectional view of an actuator associated with one embodiment of the present invention.

An actuator associated with one embodiment of the present invention is first described by referring to FIG. 1, which is a schematic cross section of the actuator, 100. The actuator 100 includes a ball spline 20 and an encoder 50 both of which are shown in simplified form in FIG. 1.

As shown also in FIG. 1, the actuator 100 includes an electric motor 10, a sliding screw 30, bearings 40, 42, and a case 60, as well as the aforementioned ball spline 20 and encoder 50.

The motor 10 is configured including a magnet 12, a rotor 14, and coils 16. The magnet 12 is held on the inner surface of the case 60. For example, the magnet 12 is a permanent magnet. The rotor 14 is rotatably supported on the case 60 via the bearings 40, 42. The coils 16 are held on the outer surface of the rotor 14. Electric current is supplied to the coils 16 from a controller (not shown). In the motor 10, the rotor 14 is rotated by utilizing a force acting on the current flowing through the coils 16 within the magnetic field produced by the magnet 12.

The ball spline 20 is configured including a shaft 22, balls 24, and a bearing 26 and has a finite stroke length. That is, the ball spline 20 does not have any mechanism (such as a cyclic ball path) for cycling the balls 24.

Figure 2:
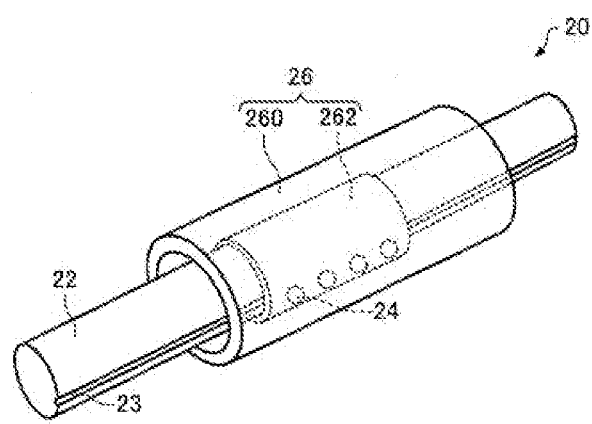
FIG. 2 is a schematic perspective view of the ball spline of fine stroke length shown in FIG. 1.

FIG. 2 is a schematic perspective view of the ball spline 20.

The shaft 22 acts as a spline shaft in the ball spline 20. The shaft 22 is the output shaft of the actuator 100. Rolling grooves (spline grooves) 23 extending along the axis of the shaft 22 are formed in the outer surface of the front end of the shaft 22. The balls 24 can roll along the rolling grooves 23. The rolling grooves 23 are plural in number. No restriction is placed on the number of the rolling grooves 23.

The balls 24 can roll along the rolling grooves 23. In the rolling grooves 23, the plural balls 24 are arranged as ball rows axially of the shaft 22.

The bearing 26 is secured to the case 60 and provides support of the shaft 22 via the balls 24. The bearing 26 has a cylindrical outer cylinder (also referred to as spline outer cylinder) 260 and a holder 262. The outer cylinder 260 is held to the inner surface of the case 60 and provided with rolling grooves (not shown) corresponding to the rolling grooves 23 in the shaft 22. The balls 24 are rollably interposed between the rolling grooves 23 in the shaft 22 and the rolling grooves in the outer cylinder 260. The bearing holder 262 is disposed inside the outer cylinder 260 and operates such that the balls 24 are held in a spaced relation to each other.

The bearing 26 is so designed that the balls 24 are held by the ball holders 262 in a non-contact relation with each other. The holder 262 is of non-cyclic type and does not permit the balls 24 to circulate. During linear motion of the shaft 22, the holder 262 also moves and, therefore, the stroke length is finite. That is, in the ball spline 20, the balls 24 roll only along the rolling grooves 23 but do not in any cyclic path. Consequently, a given preload is applied to the balls 24 at all times. The shaft 22, balls 24, and bearing 26 are made, for example, of stainless steel.

In the ball spline 20, the shaft 22 is supported by the bearing 26 via the balls 24. Since the balls 24 roll along the rolling grooves 23 formed along the axis of the shaft 22, rotation of the shaft 22 about its axis is suppressed and thus the shaft 22 moves linearly axially.

The ball spline 20 is preloaded to eliminate any clearance in the direction of rotation. Consequently, generation of rotation and wobble of the shaft 22 can be better suppressed. Thus, in the actuator 100, only axial thrust force can be transmitted to the driven object.

The sliding screw 30 is a mechanism for transforming the rotary motion of the rotor 14 of the motor 10 into a linear motion of the shaft 22 as shown in FIG. 1. The sliding screw 30 acts as a feeding mechanism for sliding the output shaft (shaft 22) of the actuator 100 back or forth. The sliding screw 30 is configured including the shaft 22 and a nut 32.

An external thread 34 is formed on the rear end of the shaft 22. The nut 32 is secured to the rotor 14 of the motor 10. The nut 32 is provided with an internal thread 33 with which the external thread 34 of the shaft 22 threadedly mates. It can also be said that the nut 32 is a portion where the internal thread 33 is formed. The nut 32 is made, for example, of stainless steel.

As the rotor 14 of the motor 10 rotates, the nut 32 rotates. The internal thread 33 in the nut 32 and the external thread 34 on the shaft 22 rotate in threaded engagement, resulting in rotary motion of the screw. This moves the shaft 22 linearly.

Preferably, the external thread 34 on the shaft 22 and the internal thread 33 in the nut 32 constituting the sliding screw 30 are polished. In this case, the sliding screw 30 shows smoother behavior with less vibrations.

The rotor 14 is rotatably supported to the case 60 by the bearings 40 and 42. The bearing 40 supports the front end side of the rotor 14, while the bearing 42 supports the rear end side of the rotor 14. In this example, the rotor 14 is rotatably supported by the two bearings 40 and 42. No restriction is imposed on the number of bearings such as the bearings 40 and 42 for supporting the rotor 41 or on how the balls are preloaded.

The encoder 50 is a sensor for detecting the rotational speed, direction of rotation, and angular position of the rotor 14 of the motor 10 and informs the controller of these kinds of information. The encoder 50 is disposed inside the case 60.

The case 60 accommodates the motor 10, the ball spline 20, the sliding screw 30, the bearings 40, 42, and the encoder 50. For example, the case 60 may close the magnetic path of the magnet 12 of the motor 10 and constitute a magnetic circuit.

The operation of the actuator 100 is now described. In the actuator 100, if electrical current is supplied from the controller to the coils 16 of the motor 10, the rotor 14 of the motor 10 rotates. When the motor 10 is rotationally driven, the rotary force of the rotor 14 is transformed into an axial thrust force of the shaft 22 via the nut 32. That is, the rotary motion of the motor 10 is transformed into a linear motion by the sliding screw 30 including the nut 32 and the shaft 22. The shaft 22 is suppressed from rotating about its axis by the ball spline 20 and thus moved linearly. Consequently, the shaft 22, i.e., the output shaft of the actuator 100, transmits the axial thrust force of the shaft 22 to the driven object.

The actuator 100 has the following features. The actuator 100 includes the motor 10, the ball spline 20 of finite stroke length having the shaft 22 provided with the rolling grooves 23, and the nut 32 having the internal thread 33 in threaded engagement with the external thread 34 formed on the shaft 22. The nut 32 transmits the rotary force of the motor 10 to the shaft 22. In this way; in the actuator 100, the shaft 22 of the ball spline 20 is used as the output shaft of the actuator.

Therefore, when the output shaft is moved back or forth, only the axial thrust force of the shaft 22 can be transmitted to the driven object.

Furthermore, the actuator 100 uses the ball spline 20 of finite stroke length. That is, the ball spline 20 does not have any cyclic path for the balls 24 and can make the preload applied to the balls 24 constant; otherwise, vibrations would be produced. Therefore, during operation of the actuator 100, vibrations of the shaft 22 can be reduced. Consequently, vibrations produced when a thrust force is applied to the driven object can be reduced. For example, a thrust force can be applied to the driven object without vibrating it.

For example, where the ball spline is an endlessly cyclic ball spline having a cyclic path for balls, when balls move between the cyclic path and the rolling grooves, the preload on the balls may vary, vibrating the shaft. On the other hand, the actuator 100 does not have any cyclic path for the balls 24 as described previously. Consequently, the preload on the balls 24 can be made constant. Hence, vibrations of the shaft 22 can be reduced.

Additionally, in the actuator 100, the sliding screw 30 is used as a mechanism for transforming the rotary force of the motor 10 into a thrust force. The sliding screw 30 provides higher rigidity and lower vibration transmission efficiency, for example, than where a ball screw is used to transform the rotary force of a motor into a thrust force by causing balls to cycle through helical rolling grooves formed in a ball screw shaft. The power transmission efficiency of the ball screw is 90% or more, for example. Consequently, in the actuator 100, minute vibrations produced by quite slight rotations of the motor 10 due to its magnetic hysteresis or by unintentional excitation of the motor 10 due to servo noises of the controller providing control of the motor 10 can be suppressed from being directly transmitted to the shaft 22.

The expression "servo noises" referred to herein means that ripple noises from the power supply and converter and the drive frequency components of the control circuit pass into the power supply line of the actuator and into the encoder control line in spite of the fact that there is no positional deviation and the settling control is complete. This results in unintentional excitation or resonance of the coils, trembling the motor.

Further, in the actuator 100, the rotary force of the motor 10 is transformed into an axial thrust force by the sliding screw 30 that can provide smaller increments of motion than possible with a ball screw. This allows for microscopic increments of motion (e.g., on the Angstrom order) over the whole range of the stroke of the shaft 22. In addition, in the actuator 100, the driven object can be moved over a wider range, for example, than where a piezoelectric device is used to impart a thrust force to the driven object. During a process in which the piezoelectric device expands or contracts, it is difficult to control the responsive expansion or contraction of the piezoelectric device linearly in terms of time and so it takes long to permit the piezoelectric device to settle down. In the actuator 100, the rotary force of the motor 10 is transmitted by the nut 32 and shaft 22. Hence, higher rigidity can be accomplished, and the settling time can be shortened.

Furthermore, the actuator 100 needs no speed reducer. If a speed reducer is used, unstable operation will be caused either by a dead zone generated due to backlash intrinsic to the speed reducer or by hysteresis of various members. Operation of the actuator 100 near its minimum increments of motion can be stabilized.

In the ball spline 20 of the actuator 100, the balls 24 roll only along the rolling grooves 23. That is, the ball spline 20 does not have any cyclic path permitting cyclic motion of the balls 24. The balls can be preloaded with a constant force; otherwise, vibrations would be produced. Therefore, during operation of the actuator 100, vibrations of the shaft 22 can be reduced. Consequently, vibrations produced when a thrust force is applied to the driven object can be reduced. Hence, a thrust force can be applied to the driven object without vibrating it.

2. Sample Positioning Device

Figure 3:
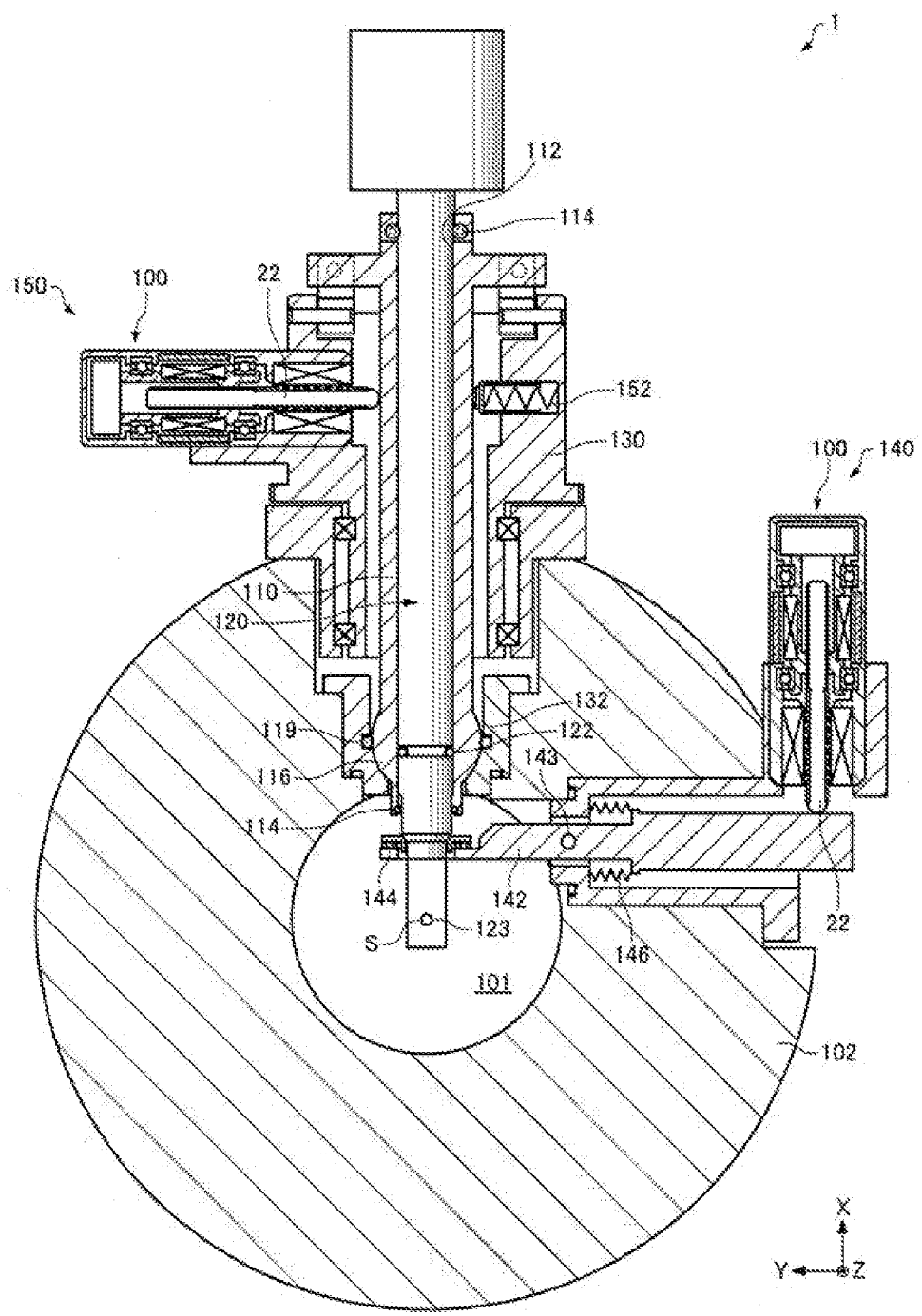
FIG. 3 is a schematic vertical cross section of a sample positioning device associated with one embodiment of the invention.

A sample positioning device associated with one embodiment of the present invention is next described by referring to FIG. 3, which schematically shows the sample positioning device, 1. FIG. 3 shows a state in which a sample holder 120 is mounted on a shifter 110. In FIG. 3, X-, Y-, and Z-axes are shown as mutually perpendicular axes. How the sample positioning device 1 is used is described below. In the present embodiment, the positioning device 1 is a device for placing a TEM (transmission electron microscope) sample in position.

As shown in FIG. 3, the sample positioning device 1 includes the shifter 110 (that is a tubular member), the sample holder 120, a shifter support member 130, an X drive mechanism 140, and a Y drive mechanism 150.

The sample positioning device 1 can bring a sample S into a desired position in the sample chamber 101 and hold the sample there. In particular, the positioning device 1 can support the sample S by means of the sample holder 120 and linearly move the sample S in the X-axis and Y-axis directions by the drive mechanisms 140 and 150. Furthermore, the positioning device 1 may move the sample S linearly in the Z-axis direction by a Z drive mechanism (not shown) or tilt the sample S about the X-axis by a tilting mechanism (not shown). In the illustrated example, the Z-axis direction is the direction in which an electron beam (not shown) passing through the sample chamber 101 travels.

In the sample positioning device 1, the shifter 110 is supported by the shifter support member 130 mounted so as to extend through a wall portion 102. The shifter 110 is provided with a hole 112 in communication with the sample chamber 101. The sample holder 120 is movably installed in the hole 112. The sample holder 120 has a front end portion where the sample S is installed, the front end portion being disposed in the sample chamber 101. The X drive mechanism 140 moves the sample S in the X-axis direction by moving the sample holder 120. The Y drive mechanism 150 moves the sample S in the Y-axis direction by rotating the shifter 110.

The various members constituting the sample positioning device 1 are described below. The sample chamber 101 can be maintained at subatmospheric pressure by evacuating the sample chamber 101 by a well-known pump (not shown). The sample S is introduced into the sample holder 101 by means of the sample holder 120. In the sample chamber 101, the sample S is irradiated with the electron beam.

The shifter support member 130 is a cylindrical member that extends through the wall portion 102. The shifter 110 is inserted in the shifter support member 130. A spherical bearing 132 is mounted on the side of the shifter support member 130 that faces the sample chamber 101, and has a spherical inner surface.

The shifter 110 is a tubular member and has the hole 112 in communication with the sample chamber 101. In the illustrated example, the hole 112 extends through the shifter in the X-axis direction. The sample holder 120 is installed in the hole 112. Consequently, motions of the sample holder 120 in the Y-axis and Z-axis directions are restricted. The holder 120 can move linearly in the X-axis direction. Bearings 114 supporting the sample holder 120 are mounted inside the shifter 110. In the illustrated example, the bearings 114 are mounted at opposite ends, respectively, of the shifter 110, i.e., near the opening in the hole 112. The bearings 114 can smoothen the motion of the sample holder 120 in the X-axis direction.

The shifter 110 has a spherical portion 116 at its end closer to the sample chamber 101. The surface of the spherical portion 116 is formed like a sphere whose center lies in the central axis of the hole 112. The spherical portion 116 is supported by the spherical bearing 132 that is formed such that its inner surface is in contact with the surface of the spherical portion 116. Consequently, the spherical portion 116 is slidably supported to the spherical bearing 132. Therefore, the shifter 110 can rotate about the center of the spherical portion 116. An O-ring 119 is mounted between the spherical portion 116 and the spherical bearing 132 to hermetically seal the sample chamber 101.

The sample holder 120 is movably installed in the hole 112 of the shifter 110. The sample holder 120 has a front end portion that forms a sample holding portion 123 for holding the sample S. An O-ring 122 is fitted over the sample holder 120 to provide hermetic sealing between the sample holder 120 and the shifter 110. As the sample holder 120 moves, the O-ring 122 slides inside the hole 112 of the shifter 110.

The drive mechanisms 140 and 150 can vary the position of the sample holder 120 within the sample chamber 101. In particular, the drive mechanisms 140 and 150 operate the sample holder 120 to bring the sample S into a desired position in the sample chamber 101 and stop the sample.

The X drive mechanism 140 moves the sample S along the X-axis direction. The X drive mechanism 140 is configured including an actuator associated with the present invention (the actuator 100 in the illustrated example). The X drive mechanism 140 further includes a lever 142.

The lever 142 is a mechanical lever that can rotate about a shaft 143. A bearing 144 is mounted at the end of the lever 142 closer to the sample chamber 101. The sample holder 120 is supported via the bearing 144 that can roll within the Y-Z plane. This smoothens the movement of the sample S in the Y-axis direction. Since a force in the negative X-axis direction is exerted on the sample holder 120, the holder 120 is pressed against the lever 142 (bearing 144). The shaft 22 (output shaft) of the actuator 100 is in contact with the end of the lever 142 that faces away from the sample chamber 101.

The actuator 100 moves the shaft 22 linearly in the X-axis direction, so that the lever 142 rotates about the shaft 143, moving the sample holder 120 and the sample S linearly in the X-axis direction. A bellows 146 can smoothen the movement of the lever 142 while maintaining the sample chamber 101 at subatmospheric pressure.

The Y drive mechanism 150 moves the sample S in the Y-axis direction. The Y drive mechanism 150 is configured including an actuator associated with the present invention (the actuator 100 in the illustrated example). Furthermore, the Y drive mechanism 150 includes a return spring 152. The front end of the shaft 22 of the actuator 100 is in contact with the outermost surface of the shifter 110 as viewed in the positive Y-axis direction. The return spring 152 is mounted on the outermost surface of the shifter 110 as viewed in the negative Y-axis direction. The return spring 152 biases the shifter 110 in the positive Y-axis direction. Since the actuator 100 moves the shaft 22 linearly in the Y-axis direction, the shifter 110 rotates about the center of the spherical portion 116. This permits the sample S to be moved linearly in the Y-axis direction.

The sample positioning device 1 may further include a Z drive mechanism (not shown) for moving the sample S in the Z-axis direction. The Z drive mechanism may be similar in configuration to the Y drive mechanism 150. In addition, the sample positioning device 1 may include a mechanism (not shown) for tilting the sample S about the X-axis.

The operation of the sample positioning device 1 is next described. In the sample positioning device 1, the sample S is moved in the X-axis direction by moving the sample holder 120 in the X-axis direction by means of the X drive mechanism 140. In particular, the sample holder 120 is moved linearly in the X-axis direction by sliding back or forth the shaft 22 of the actuator 100 constituting the X drive mechanism 140 so as to rotate the lever 142. As a result, the sample S moves in the X-axis direction.

Furthermore, in the sample positioning device 1, the sample S is moved in the Y-axis direction by moving the shifter 110 by means of the Y drive mechanism 150 so as to move the sample holder 120. In particular, the shifter 110 is rotated about the center of the spherical portion 116 by pulling the shaft 22 of the actuator 100 constituting the Y drive mechanism 150 in and out. As the shifter 110 rotates in this way, the sample holder 120 also rotates, moving the sample S in the Y-axis direction.

The sample positioning device 1 has the following features. The sample positioning device 1 includes the actuator 100. As described previously, during operation of the actuator 100, the actuator 100 can reduce vibrations of the shaft 22. Therefore, in the sample positioning device 1, when the sample S is moved, vibrations of the sample S can be reduced. Consequently, with the sample positioning device 1, the user can observe the sample S at high magnification while moving the sample S in the X- or Y-axis direction.

Since the sample positioning device 1 includes the actuator 100, quite small increments of motion (such as on the order of Angstroms) are possible over the whole stroke length of the shaft 22 as described previously. Therefore, the driven object can be moved over a wider range, for example, than where a thrust force is applied to the driven object using a piezoelectric device. Thus, the sample positioning device 1 allows for quite small increments of motion (such as on the order of Angstroms) along the whole length of the sample S which has a diameter of 2 mm, for example. As a consequence, drift correction can be made, for example, over the whole length of the sample S.

Therefore, in the sample positioning device 1, when elemental mapping, spectral analysis, atomic analysis, or other analysis that needs a long-time drift correction is made or when an in situ observation such as heating, cooling, tomography, or the like that needs drift correction over a long distance is performed, it is possible to prevent the drift correction procedure from coming out of range of the stroke.

Furthermore, the sample positioning device 1 includes the actuator 100 and so the settling time can be shortened as compared with the case where a thrust force is applied to the driven object, for example, using a piezoelectric device as described previously. Thus, drift of the sample S can be settled down in a shorter time.

3. Electron Microscope

Figure 4:
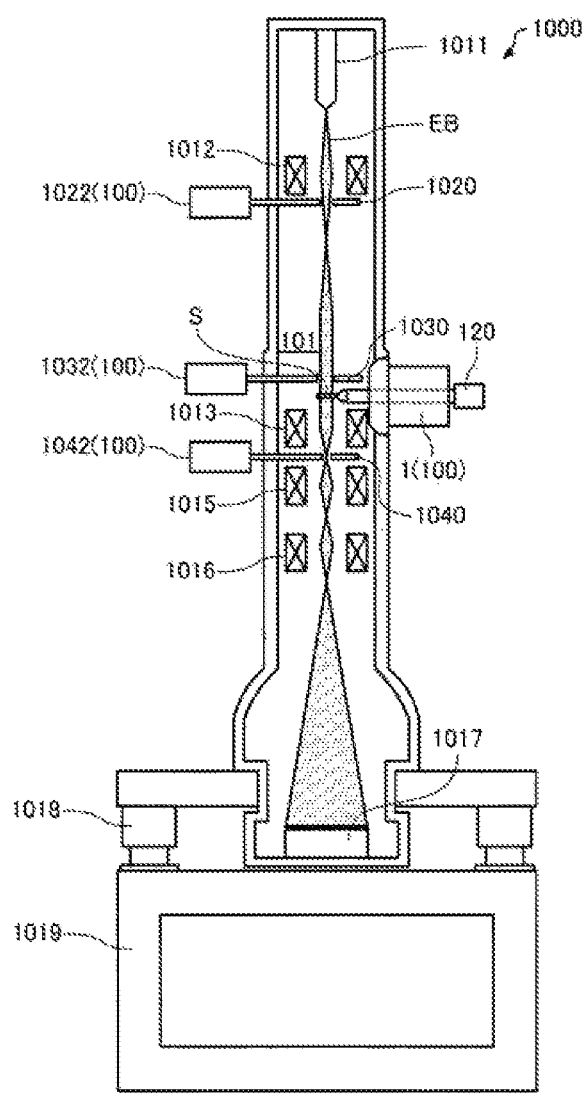
FIG. 4 is a schematic vertical cross section of an electron microscope associated with one embodiment of the invention.

An electron microscope associated with the present embodiment is next described by referring to FIG. 4, which shows the configuration of the electron microscope, 1000. FIG. 4 shows a state in which a sample S has been introduced in the sample chamber 101.

For example, the electron microscope 1000 has the configurations of a transmission electron microscope (TEM). The microscope 1000 includes a sample positioning device associated with the present invention (the sample positioning device 1, in the illustrated example).

The electron microscope 1000 further includes an electron beam source 1011, a condenser lens system 1012, an objective lens 1013, an intermediate lens system 1015, a projector lens 1016, an imager 1017, a condenser aperture 1020, a condenser aperture positioning device 1022, an objective aperture 1030, an objective aperture positioning device 1032, a selected area aperture 1040, and a selected area aperture positioning device 1042.

The electron beam source 1011 emits an electron beam EB by accelerating electrons, which are produced from a cathode, by means of an anode. For example, an electron gun can be used as the electron beam source 1011. No restriction is imposed on the electron gun used as the electron beam source 1011. A thermionic-emission electron gun, thermal field-emission electron gun, cold field emission gun, or the like can be used.

The condenser lens system 1012 is located behind (on the downstream side as viewed along the stream of the electron beam EB) the electron beam source 1011. The condenser lens system 1012 is used such that the electron beam EB produced by the electron beam source 1011 is focused onto the sample S. The condenser lens system 1012 may be configured including a plurality of lenses (not shown).

The objective lens 1013 is located behind the condenser lens system 1012. The objective lens 1013 is an initial stage of lens for imaging the electron beam EB transmitted through the sample S. The objective lens 1013 has an upper polepiece and a lower polepiece (none of which are shown). In the objective lens 1013, a magnetic field is produced between the upper and lower polepieces to focus the electron beam EB.

The sample positioning device 1 places the sample S between the upper and lower polepieces of the objective lens 1013, the sample S being held by the sample holder 120. As described previously, the sample positioning device 1 places the sample S in position, the sample S being held on the sample holder 120 within the sample chamber 101. The sample positioning device 1 can move the sample S in a horizontal direction perpendicular to the direction of travel of the electron beam EB by means of the drive mechanisms 140 and 150 each having the actuator 100.

The intermediate lens system 1015 is disposed behind the objective lens 1013 and may be configured including a plurality of lenses (not shown). The projector lens 1016 is disposed behind the intermediate lens system 1015. The intermediate lens system 1015 and the projector lens 1016 cooperate to further magnify the image focused by the objective lens 1013 and to focus the magnified image onto the imager 1017. In the electron microscope 1000, the objective lens 1013, intermediate lens system 1015, and projector lens 1016 together constitute an imaging system.

The imager 1017 captures a TEM image focused by the imaging system. For example, the imager 1017 is a digital camera such as a CCD camera or a CMOS camera.

The condenser aperture 1020 is disposed, for example, between the condenser lens system 1012 and the objective lens 1013. The condenser aperture 1020 can adjust the angular aperture of the electron beam EB impinging on the sample S and the dose of the beam, for example. The condenser aperture 1020 is a movable aperture capable of selecting its hole diameter or adjusting its position from outside the vacuum.

The condenser aperture positioning device 1022 is used to move the condenser aperture 1020 to select a hole diameter of the aperture or adjust its position. The aperture positioning device 1022 has an actuator associated with the present invention (the actuator 100 in the illustrated example) as its drive source. Consequently, the condenser aperture 1020 can be moved in very small steps without vibrating the aperture 1020. As such, the condenser aperture 1020 can be placed in position accurately. Furthermore, after the condenser aperture 1020 is moved, its drift can be settled down in a shorter time.

The objective aperture 1030 is disposed at the back focal plane of the objective lens 1013. The objective aperture 1030 is an aperture for accepting transmitted waves or diffracted waves for obtaining a bright field image or a dark field image. The objective aperture 1030 is a movable aperture capable of selecting a hole diameter of the aperture or selecting its position from outside the vacuum.

The objective aperture positioning device 1032 is used to move the objective aperture 1030 to select a hole diameter of the aperture or adjust its position. The objective aperture positioning device 1032 has an actuator associated with the present invention (the actuator 100 in the illustrated example) as its drive source. Consequently, the objective aperture 1030 can be moved in very small steps without vibrating it and thus can be placed in position accurately. Furthermore, after the objective aperture 1030 is moved, drift can be settled down more quickly than heretofore.

The selected area aperture 1040 is disposed at the image plane of the objective lens 1013 (i.e., the image plane of the intermediate lens system 1015). The selected area aperture 1040 limits the area of the sample S from which a diffraction pattern is obtained when selected area diffraction is performed. The selected area aperture 1040 is a movable aperture capable of selecting a hole diameter of the aperture or adjusting its position from outside the vacuum.

The selected area aperture positioning device 1042 is used to move the selected area aperture 1040 to select a hole diameter of the aperture or adjust its position. The aperture positioning device 1042 has an actuator associated with the present invention (the actuator 100 in the illustrated example) as its drive source. Consequently, the selected area aperture 1040 can be moved in very small steps without vibrating it and thus the selected area aperture 1040 can be placed in position accurately. Furthermore, after the selected area aperture 1040 is moved, drift can be settled down in a shorter time.

In the illustrated example, the electron microscope 1000 is installed on a pedestal 1019 via vibration isolators 1018.

4. Modifications

It is to be understood that the present invention is not restricted to the above-described embodiments and that the embodiments can be practiced in various modified forms without departing from the gist and scope of the present invention.

For example, in the above-described embodiments, the motor 10 of the actuator 100 is configured including the magnet 12, rotor 14, and coils 16 as shown in FIG. 1. The construction of the motor 10 is not restricted to this example. The motor 10 may be a magnetic motor such as an AC servomotor, a DC servomotor, or a stepping, motor. That is, the principles of the actuator 100 can be applied to a linear actuator that transforms the rotary force of the magnetic motor 10 into a thrust force.

For example, in the description of the above-described embodiments, the actuators 100 are employed in the sample positioning device 1 for an electron microscope as shown in FIG. 3 and in the aperture positioning devices 1022, 1032, and 1042 as shown in FIG. 4. Each actuator 100 may also be used as a detector positioning device for moving an electron microscope detector (such as an EDS detector or a dark field detector) and placing the detector in position.

Furthermore, in the description of the above-described embodiments, the sample positioning device 1 is applied to a transmission electron microscope (TEM). The sample positioning device 1 may also be applied to other charged particle beam systems including electron microscopes (such as scanning electron microscope (SEM), transmission electron microscope (TEM), and scanning transmission electron microscope (STEM)), focused ion beam (FIB) systems, and electron beam exposure systems.

It is to be noted that the above-described embodiments and modifications are merely exemplary and that the present invention is not restricted thereto. For example, the embodiments and modifications may be appropriately combined.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. An actuator comprising:
    an electric motor;
    a nut having internal threads driven by the motor;
    a axially shiftable shaft having external threads threadedly mating the internal threads of the nut whereby the nut transmits the rotary force of the nut to the shaft;
    a ball spline having a finite stroke length and including an outer cylinder, a ball holder secured within the outer cylinder, said holder with ball sockets aligned parallel to the axis of the shaft, and balls in said sockets, said shaft provided with rolling grooves formed along an axis and along which said balls can roll,
    wherein said balls roll only along the axis of said rolling grooves formed in said ball spline.

2. The actuator as set forth in claim 1, wherein said shaft and said nut together constitute a sliding screw for transforming the rotary motion of said motor into a linear motion.

3. The actuator as set forth in claim 1, wherein said nut is secured to a rotor of said motor.

4. A sample positioning device for placing a sample in position within a sample chamber of a charged particle beam system, said sample positioning device including an actuator as set forth in claim 1.

5. A charged particle beam system including a sample positioning device as set forth in claim 4.

6. A charged particle beam system including an actuator as set forth in claim 1.

* * * * *